(12) United States Patent
Snodgrass et al.

(10) Patent No.: US 7,976,261 B2
(45) Date of Patent: Jul. 12, 2011

(54) APPARATUS FOR MOVING AND SECURING A SUBSTRATE

(75) Inventors: Scott Snodgrass, Rowlett, TX (US); Gregory M. Gibson, Dallas, TX (US)

(73) Assignee: FAS Holdings Group, LLC, Dallas, TX (US)

( * ) Notice: Subject to any disclaimer, the term of this patent is extended or adjusted under 35 U.S.C. 154(b) by 468 days.

(21) Appl. No.: 12/124,052

(22) Filed: May 20, 2008

(65) Prior Publication Data
US 2009/0290960 A1 Nov. 26, 2009

(51) Int. Cl.
*B65G 35/00* (2006.01)
(52) U.S. Cl. .................. 414/222.01; 414/752.1; 198/604
(58) Field of Classification Search ............ 414/222.01, 414/752.1, 749.1, 411, 676, 677; 269/55; 198/604, 605
See application file for complete search history.

(56) References Cited

U.S. PATENT DOCUMENTS

| | | | |
|---|---|---|---|
| 5,352,294 A | 10/1994 | White et al. | |
| 5,611,865 A | 3/1997 | White et al. | |
| 6,572,091 B2 * | 6/2003 | Kimble | 269/21 |
| 6,736,588 B1 * | 5/2004 | Baldwin et al. | 414/676 |
| 6,835,040 B2 * | 12/2004 | Quiring | 414/281 |
| 7,055,535 B2 | 6/2006 | Kunisawa et al. | |
| 7,137,309 B2 | 11/2006 | Weiss et al. | |
| 2008/0069677 A1 * | 3/2008 | Kawachi et al. | 414/676 |

* cited by examiner

*Primary Examiner* — Donald Underwood
(74) *Attorney, Agent, or Firm* — Mark D. Perdue, Esq.; Storm LLP

(57) ABSTRACT

An apparatus for transferring and securing a substrate is shown. A pressure source is provided that is adapted to provide positive and negative pressure. A vacuum chuck is provided having a top side with a plurality of vacuum chuck portals formed therein. Each vacuum chuck portal is in fluid communication with the pressure source. The substrate is secured to the top side of the vacuum chuck when the pressure source provides negative pressure to the vacuum chuck portals. An intermediate member that selectively cooperates with the vacuum chuck to support and transfer the substrate between the vacuum chuck and the intermediate member is provided. The intermediate member has a plurality of receiving spaces and a plurality of transfer members. The receiving spaces and transfer members are adjacent to one another in an alternating pattern, and each transfer member has a top side with a plurality of transfer member portals formed therein. Each transfer member portal is in fluid communication with the pressure source. A carriage extending along at least a portion of the periphery of the vacuum chuck and along at least a portion of the periphery of the intermediate member is provided. The carriage engages at least a portion of the substrate when the pressure source provides positive pressure to the vacuum chuck portals and transfer member portals to transfer the substrate between the intermediate member and the vacuum chuck.

19 Claims, 6 Drawing Sheets

APPARATUS FOR MOVING AND SECURING A SUBSTRATE

TECHNICAL FIELD

The invention relates generally to moving and securing a substrate and, more particularly, to a system for moving and securing a flexible substrate for the purpose of coating the substrate with a desired coating.

BACKGROUND

The use of Thin Film Transistor (TFT) displays have become commonplace over the years. In fact, TFT displays have become so ubiquitous that there is an ever-increasing desire to implement these displays in more devices. Typically, TFT displays are "built on" a flexible plastic substrate. These flexible substrates, though, are difficult to handle in comparison to the glass substrates of their Flat Panel Display (FPD) counterparts. With the glass of the FPDs, it is relatively easy to maneuver the glass because of its rigidity, but the substrates of the TFT displays tend to bend and move very easily under the influence of gravity, causing limited maneuverability. Some examples of devices that address maneuvering substrates are U.S. Pat. Nos. 5,352,294; 5,611,865; 7,055,535; and 7,137,309. Therefore, there is a need for an apparatus and/or system to move flexible substrates.

SUMMARY

A preferred embodiment of the present invention, accordingly, provides an apparatus for transferring and securing a substrate. A pressure source is provided that is adapted to provide positive and negative pressure. A vacuum chuck is provided having a top side with a plurality of vacuum chuck portals formed therein. Each vacuum chuck portal is in fluid communication with the pressure source. The substrate is secured to the top side of the vacuum chuck when the pressure source provides negative pressure to the vacuum chuck portals. An intermediate member that selectively cooperates with the vacuum chuck to support and transfer the substrate between the vacuum chuck and the intermediate member is provided. The intermediate member has a plurality of receiving spaces and a plurality of transfer members. The receiving spaces and transfer members are adjacent to one another in an alternating pattern, and each transfer member has a top side with a plurality of transfer member portals formed therein. Each transfer member portal is in fluid communication with the pressure source. A carriage extending along at least a portion of the periphery of the vacuum chuck and along at least a portion of the periphery of the intermediate member is provided. The carriage engages at least a portion of the substrate when the pressure source provides positive pressure to the vacuum chuck portals and transfer member portals to transfer the substrate between the intermediate member and the vacuum chuck.

In accordance with a preferred embodiment of the present invention, the pressure source further comprises a manifold that is in fluid communication with the vacuum chuck portals and transfer member portals, a vacuum pump in selective fluid communication with the manifold, and a positive pressure pump that is in selective fluid communication with the manifold.

In accordance with another preferred embodiment of the present invention, the intermediate member and the vacuum chuck are each generally rectangular.

In accordance with a preferred embodiment of the present invention, the carriage extends along at least a portion of a pair of opposing sides of each of the intermediate member and the vacuum chuck.

In accordance with a preferred embodiment of the present invention, the top sides of the transfer members and the vacuum chuck have an anti-static coating.

In accordance with a preferred embodiment of the present invention, the apparatus further comprises a gas ionizer located in a position above the top sides of the transfer members and the vacuum chuck.

In accordance with a preferred embodiment of the present invention, an apparatus for moving and securing a substrate is provided. A pressure source that is adapted to provide positive and negative pressure is provided. An end effector adapted to move the substrate from a first position is provided. The end effector has a base with a plurality of spaced apart tines extending therefrom and a top side with a plurality of end effector portals formed therein. Each end effector portal is in fluid communication with the pressure source. A vacuum chuck is provided having a top side with a plurality of vacuum chuck portals formed therein. Each vacuum chuck portal is in fluid communication with the pressure source. The substrate is secured to the top side of the vacuum chuck when the pressure source provides negative pressure to the vacuum chuck portals. An intermediate member that selectively cooperates with the vacuum chuck to support and transfer the substrate between the vacuum chuck and the intermediate member is provided. The intermediate member has a plurality of receiving spaces and a plurality of transfer members. Each receiving space is adapted to receive at least one tine, and each transfer member is adjacent to at least one tine when the end effector engages the intermediate member. Each transfer member has a top side with a plurality of transfer member portals formed therein that are each in fluid communication with the pressure source. A carriage extending along at least a portion of the periphery of the vacuum chuck and along at least a portion of the periphery of the intermediate member is provided. The carriage engages at least a portion of the substrate when the pressure source provides positive pressure to the vacuum chuck portals and transfer member portals to transfer the substrate between the intermediate member and the vacuum chuck.

In accordance with a preferred embodiment of the present invention, an apparatus for moving and securing a substrate is provided. A pressure source that is adapted to provide positive and negative pressure is provided. An end effector is provided having a base with a plurality of spaced apart tines extending therefrom. The end effector has a top side with a plurality of end effector portals formed therein, and each end effector portal is in fluid communication with the pressure source. A generally rectangular vacuum chuck is provided having a top side with a plurality of vacuum chuck portals formed therein. Each vacuum chuck portal is in fluid communication with the pressure source. A generally rectangular intermediate member that selectively cooperates with the vacuum chuck to support and transfer the substrate between the vacuum chuck and the intermediate member is provided. The intermediate member has a plurality of receiving spaces and a plurality of transfer members. Each receiving space is adapted to receive at least one tine, and each transfer member is adjacent to at least one tine when the end effector engages the intermediate member. Each transfer member has a top side with a plurality of transfer member portals formed therein that are each in fluid communication with the pressure source, and the top sides of the vacuum chuck and the transfer members are generally coplanar. A mechanical arm is secured to the end effector that is adapted to move the end effector from a first position of the substrate to the intermediate member. A carriage extending along at least a portion of a pair of opposing sides of each of the intermediate member and the vacuum chuck is provided. The carriage engages at least a portion of the substrate when the pressure source provides positive pressure to the vacuum chuck portals and transfer member portals to move the substrate between the intermediate member and the vacuum chuck.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
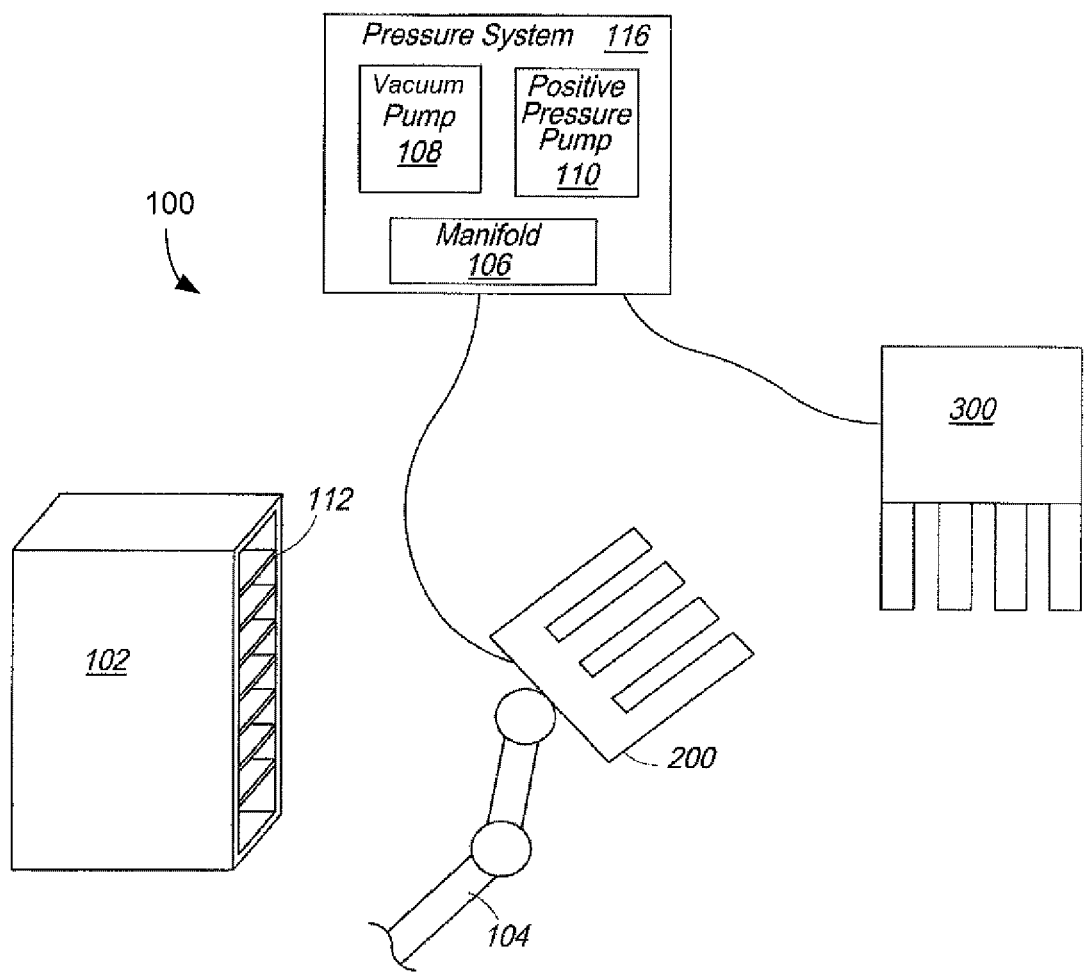
FIG. 1 is a diagram depicting the substrate transfer system in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1, a system 100 for transferring a flexible substrate 112 is shown. Typically, systems, like system 100, are factory or automation systems employed to maneuver or transfer a substrate 112, like sheets of polyethylene terephthalate (PET) used in the production process for the manufacturing of TFT displays, from a first position at one location to a second position at a second location. Here, as an example, the system 100 comprises storage 102 where the substrate 112 can be held in a first position so that the substrates can be moved or transferred to a second position at chuck assembly 300. Preferably, movement between the first and second positions is accomplished through the use of a multi-axis mechanical arm 104 and an end effector 200 that is secured to the mechanical arm 104. The preferred multi-axis mechanical arm 104 is an articulated robot.

Typically, these substrates 112 are very light (weighing on the order of a few grams) and subject to displacement by air currents and slight movements. Additionally, these substrates are usually very delicate and can be easily damaged.

Figure 2:
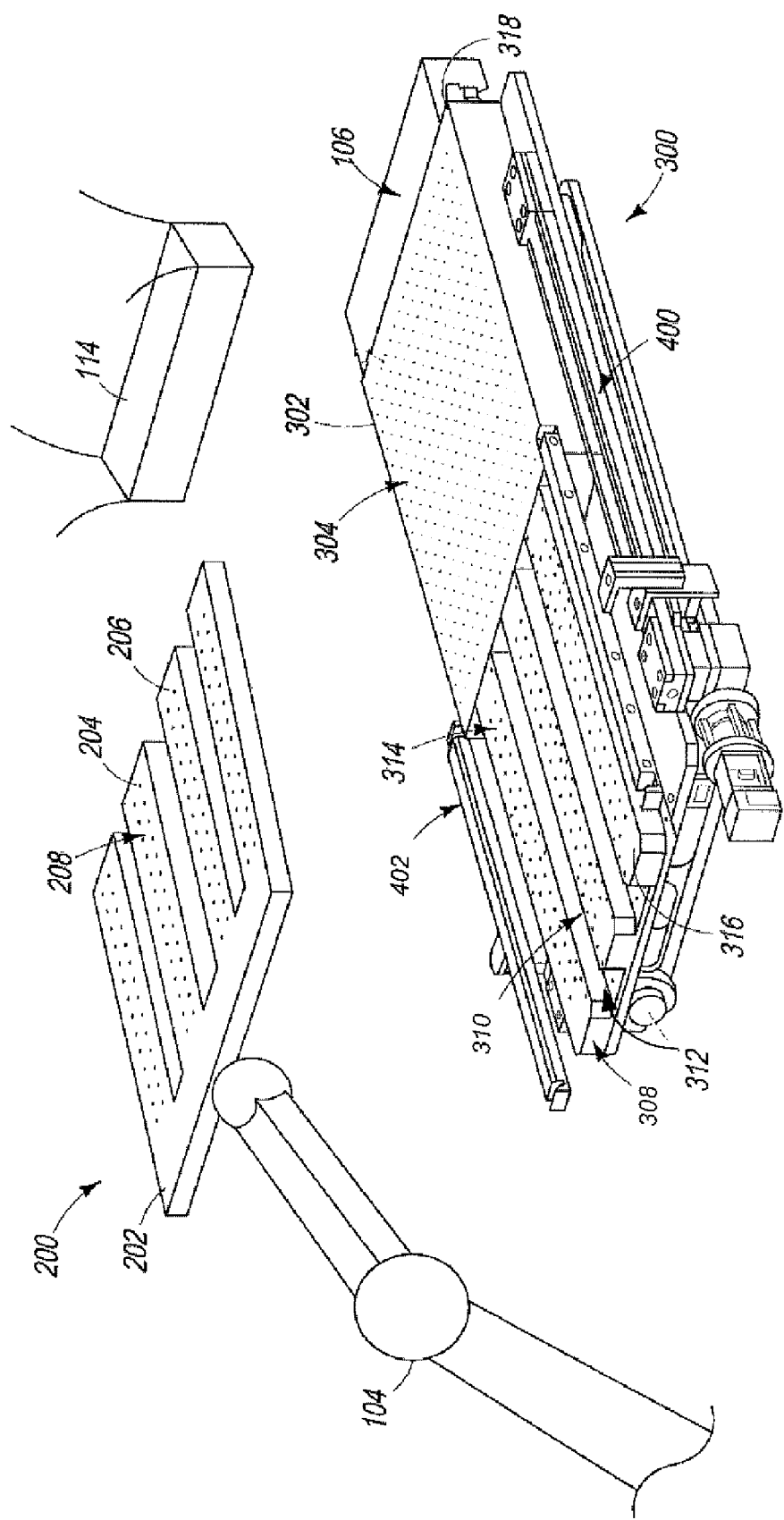
FIG. 2 is an isometric view of the chuck assembly, mechanical arm, end effector, and gas ionizer in accordance with a preferred embodiment of the present invention.
Figure 3:
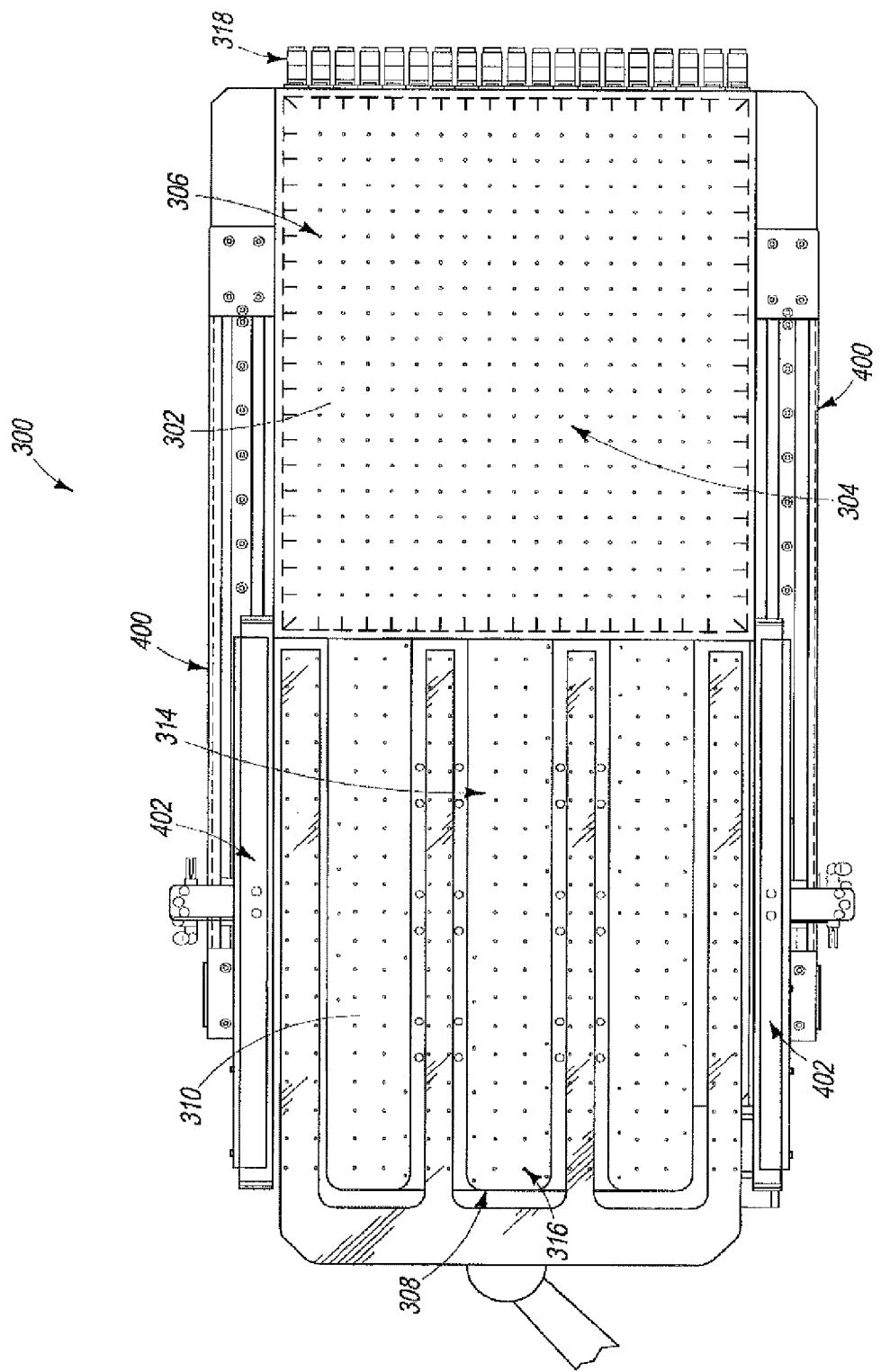
FIG. 3 is a top view of the chuck assembly in accordance with a preferred embodiment of the present invention.
Figure 4:
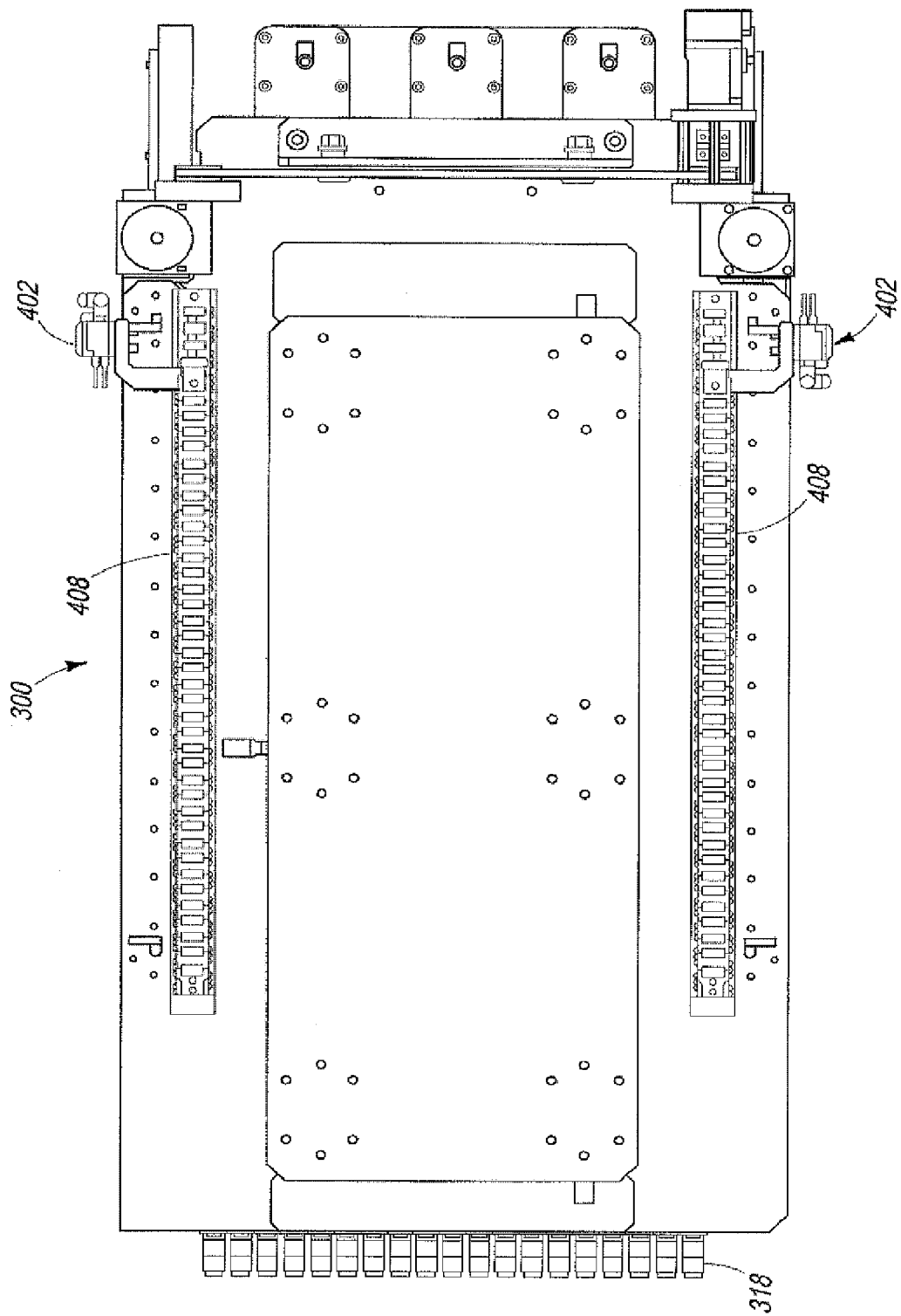
FIG. 4 is a bottom view of the chuck assembly in accordance with a preferred embodiment of the present invention.
Figure 5:
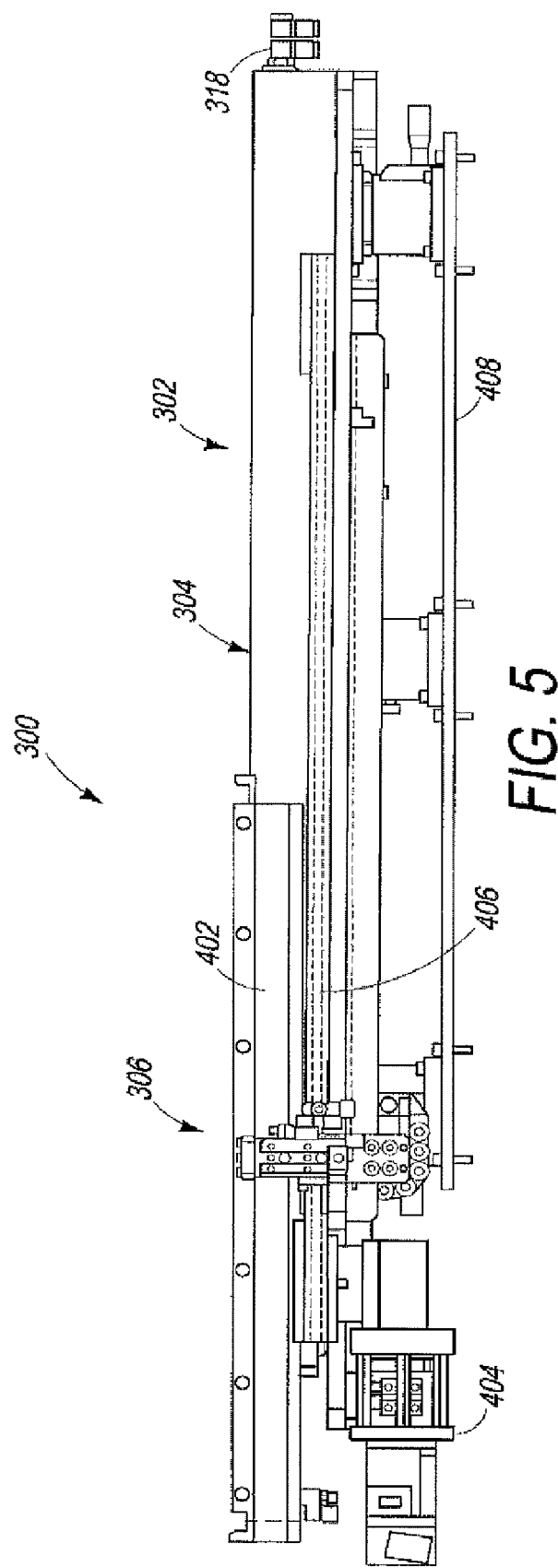
FIG. 5 is a side elevation view of the chuck assembly in accordance with a preferred embodiment of the present invention.
Figure 6:
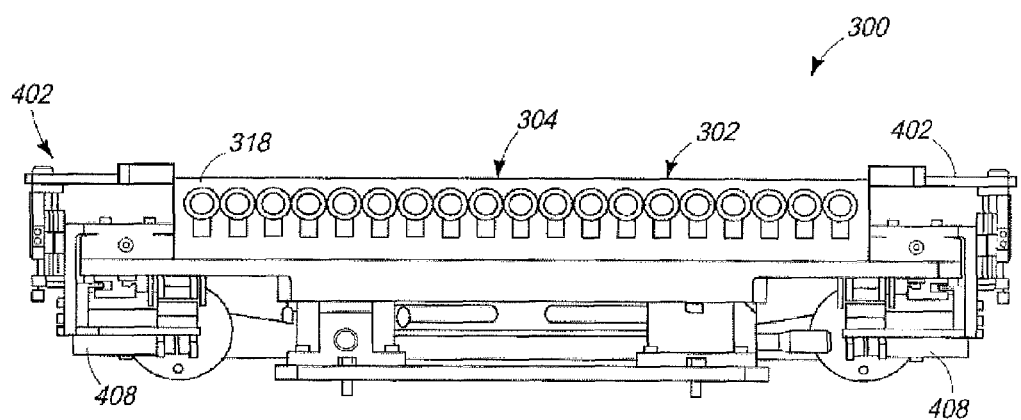
FIG. 6 is a rear elevation view of the chuck assembly in accordance with a preferred embodiment of the present invention.
Figure 7:
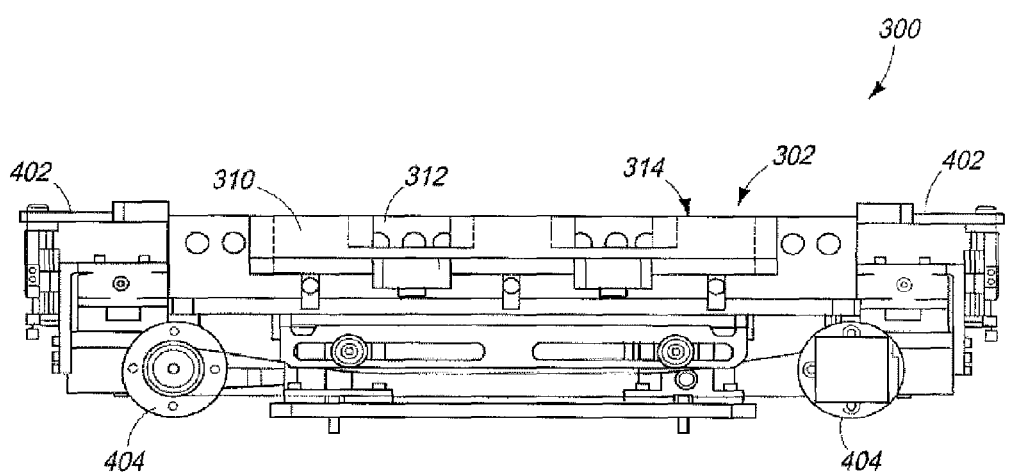
FIG. 7 is a front elevation view of the chuck assembly in accordance with a preferred embodiment of the present invention.

So, positive and negative air pressures are employed in system 100 to assist in facilitating the movement of and securing of the substrate 112. Providing the positive and negative air pressures is a pressure system (not labeled) that comprises a vacuum pump 108 and a positive pressure pump 110 that are each in fluid communication with a manifold 106 as well as other pumps, valves, and manifolds. Preferably, the pressure system (not labeled) employs the manifold 106 to control pressure delivery from the vacuum pump 108 and positive pressure pump 110, generally through the use of one or more valves (not shown). Additionally, as can be seen in FIG. 2, an example of a manifold 106 is shown. The manifold 106 is secured to nipples 318 along the edge of the chuck assembly 300 so that positive and negative pressures can be propagated to different portions of the chuck assembly (namely, the vacuum chuck portals 306 and the intermediate member portals 316 which are discussed in detail below).

Now turning to FIGS. 2-7, when substrates 112 are transferred, there typically is an interaction between the end effector 200 and the chuck assembly 300. As shown, the chuck assembly 300 can be divided into several parts comprising the vacuum 302, the intermediate member 308, and the carriage 400. When a substrate 112 is being transferred, there is an interaction between the end effector 200 and the intermediate member 308.

As shown, the end effector 200 is secured to and maneuvered by the mechanical arm 104. The end effector 200 is analogous to a fork and is comprised of a base member 202 and a plurality of tines 204. The tines 204 typically extend generally perpendicular from the base 202 and are, preferably, spaced apart from one another by about 115 mm. The base 202 and tines 204 each have a top side 208 that can be coated with an anti-static coating, like NEDOX. The base 202 is generally rectangular, being about 350 mm×150 mm×6 mm, and the tines 204 are generally rectangular, being about 40 mm×500 mm×6 mm. Formed in the top surface of the base 202 and tines 204 (or end effector 200) are a plurality of end effector portals 206. These portals 206 are in fluid communication with the pressure system (not labled) so that positive and negative pressure can be applied to the substrate 112 when carried by the end effector 200. Preferably, four tines 204 extend from the base 202.

The intermediate member 308 has a geometry that is generally complementary to that of the end effector 200. The intermediate member 308 is comprised of a plurality of receiving spaces 312 and transfer members 310 arranged in an alternating pattern. Each of the receiving spaces 312 is generally dimensioned and adapted to receive one of the tines 204, measuring about 45 mm×495 mm×20 mm. Each of the transfer members 310 measures about 70 mm×495 mm×25 mm and includes a top side 314. Preferably, the top side 314 is coated with an anti-static coating, such as NEDOX, and has a plurality of intermediate member portals 316 formed therein that are in fluid communication with the pressure system (not labeled). Preferably, there are three transfer members 310 and four receiving spaces 312.

During operation, the mechanical arm 104 moves the end effector 200 to a first position where the substrate 112 is located, such as in storage 102. The end effector is placed beneath the substrates 112, and negative pressure (vacuum) is applied through the pressure system (not labeled) to the end effector portals 206, securing the substrate 112 to the top side 208 of the end effector 200. Once the substrate 112 is secured to the end effector 200, the mechanical arm 104 moves the end effector 200 so as to engage the intermediate member 308. When the end effector 200 engages the intermediate member 308, the tines 204 are received in the receiving spaces 312 so that the top side 208 of the end effector 200 and the top side 314 of the intermediate member 308 are generally flush and/or coplanar and cooperate with one another to support the substrate 112. Once the end effector 200 engages the intermediate member 308, positive pressure can be applied to the intermediate member portals 316 and the end effector portals 206 to provide an air cushion to further manipulate or transfer the position of the substrate 112. Additionally, the process can be reversed to remove the substrate 112 from the chuck assembly 300 and transfer it to another position.

Cooperating with the intermediate member 308 is the vacuum chuck 302. The vacuum chuck 302 is generally rectangular, measuring about 400 mm×500 mm×50 mm, and is located adjacent to the intermediate member 308. The vacuum chuck 302 also includes a top side 304, which can be coated with an anti-static coating, such as NEDOX, and which is generally coplanar with the top side 314 of the intermediate member 308. The top side 304 also includes a plurality of vacuum chuck portals 306 formed therein that are in fluid communication with the pressure system (not labeled).

Additionally, a carriage 400 can be employed to assist in the transferring of a substrate 112 between the vacuum chuck 302 and the intermediate member 308. Preferably, the carriage 400 is located on and extends along at least a portion of the periphery of two opposing edges of the intermediate member 308 and the vacuum chuck 302. In particular, the carriage 400 comprises a transfer assembly 402 and a linear drive (motor 404 and linear bearing stage 406). The transfer assembly 402 can move vertically (normal to the top sides 304 and 314) so as to engage a substrate 112 along its periphery (preferably at a corner), and the motor 404 can actuate the linear bearing stage 406, which moves the transfer assembly 402 horizontally.

In moving horizontally, the transfer assembly 402 engages a pair of cable/tubing management tracks 408. The tracks 408 are, preferably, suspended from the underside or bottom of the chuck assembly 300. Therefore, the tracks 408 provide both guidance and support for the cables and tubing connected to the transfer assembly 402.

Thus, during operation and once the end effector 200 has engaged the intermediate member 308, positive pressure is applied to the end effector portals 206, the intermediate member portals 316, and vacuum chuck portals 306 thereby forming an aircushion for the substrate 112 to "float on." The transfer assembly 402 moves vertically so as to engage the substrate 112. Once engaged, the motor 404 actuates the linear bearing stage 406 to transfer the substrate 112 from the intermediate member 308 to the vacuum chuck 302. Once transferred, negative pressure can be applied to the vacuum chuck portals 306 to cause the substrate 112 to be secured to the vacuum chuck 302 so as to allow for further processing of the substrate to take place. Additionally, the process can be reversed to remove the substrate 112 from the chuck assembly 300 and transfer it to another position.

Because of the volume of air moving around the substrate 112, it is possible for the gas to become ionized, which can materially alter the properties of the substrate 112 and affect further processing of the substrate. To help combat this gas ionization, a de-ionizer 114, such as MKS Ion Systems AeroBar VF Model 5359, can be positioned above the chuck assembly 300.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

The invention claimed is:

1. An apparatus for transferring and securing a substrate, comprising:
   a pressure source that is adapted to provide positive and negative pressure;
   a vacuum chuck having a top side with a plurality of vacuum chuck portals formed therein, each vacuum chuck portal being in fluid communication with the pressure source, wherein the substrate is secured to the top side of the vacuum chuck when the pressure source provides negative pressure to the vacuum chuck portals;
   an intermediate member that selectively cooperates with the vacuum chuck to support the substrate for transfer of the substrate between the vacuum chuck and the intermediate member, the intermediate member having a plurality of receiving spaces and a plurality of transfer members, the receiving spaces and transfer members being adjacent to one another in an alternating pattern, wherein each transfer member has a top side with a plurality of transfer member portals formed therein, and wherein each transfer member portal is in fluid communication with the pressure source; and
   a carriage extending along at least a portion of the periphery of the vacuum chuck and along at least a portion of the periphery of the intermediate member, wherein the carriage engages at least a portion of the substrate when the pressure source provides positive pressure to the vacuum chuck portals and transfer member portals to transfer the substrate between the intermediate member and the vacuum chuck.

2. The apparatus of claim 1, wherein the pressure source further comprises:
   a manifold that is in fluid communication with the vacuum chuck portals and transfer member portals;
   a vacuum pump in selective fluid communication with the manifold; and
   a positive pressure pump that is in selective fluid communication with the manifold.

3. The apparatus of claim 1, wherein the intermediate member and the vacuum chuck are each generally rectangular.

4. The apparatus of claim 3, wherein the carriage extends along at least a portion of a pair of opposing sides of each of the intermediate member and the vacuum chuck.

5. The apparatus of claim 1, wherein the top sides of the transfer members have an anti-static coating.

6. The apparatus of claim 1, wherein the top side of the vacuum chuck has an anti-static coating.

7. The apparatus of claim 1, wherein the apparatus further comprises a gas ionizer located in a position above the top sides of the transfer members and the vacuum chuck.

8. An apparatus for moving and securing a substrate, comprising:
- a pressure source that is adapted to provide positive and negative pressure;
- an end effector adapted to move the substrate from a first position, the end effector having a base with a plurality of spaced apart tines extending therefrom, and the end effector having a top side with a plurality of end effector portals formed therein, and each end effector portal being in fluid communication with the pressure source;
- a vacuum chuck having a top side with a plurality of vacuum chuck portals formed therein, each vacuum chuck portal being in fluid communication with the pressure source, wherein the substrate is secured to the top side of the vacuum chuck when the pressure source provides negative pressure to the vacuum chuck portals;
- an intermediate member that selectively cooperates with the vacuum chuck to support the substrate for transfer of the substrate between the vacuum chuck and the intermediate member, the intermediate member having a plurality of receiving spaces and a plurality of transfer members, each receiving space being adapted to receive at least one tine, and each transfer member being adjacent to at least one tine when the end effector engages the intermediate member, and each transfer member having a top side with a plurality of transfer member portals formed therein that are each in fluid communication with the pressure source; and
- a carriage extending along at least a portion of the periphery of the vacuum chuck and along at least a portion of the periphery of the intermediate member, wherein the carriage engages at least a portion of the substrate when the pressure source provides positive pressure to the vacuum chuck portals and transfer member portals to transfer the substrate between the intermediate member and the vacuum chuck.

9. The apparatus of claim 8, wherein the pressure source further comprises:
- a manifold that is in fluid communication with the vacuum chuck portals and transfer member portals;
- a vacuum pump in selective fluid communication with the manifold; and
- a positive pressure pump that is in selective fluid communication with the manifold.

10. The apparatus of claim 8, wherein the intermediate member and the vacuum chuck are each generally rectangular.

11. The apparatus of claim 10, wherein the carriage extends along at least a portion of a pair of opposing sides of each of the intermediate member and the vacuum chuck.

12. The apparatus of claim 8, wherein the top sides of the transfer members have an anti-static coating.

13. The apparatus of claim 8, wherein the top side of the vacuum chuck has an anti-static coating.

14. The apparatus of claim 8, wherein the apparatus further comprises a gas ionizer located in a position above the top sides of the transfer members and the vacuum chuck.

15. An apparatus for moving and securing a substrate, comprising:
- a pressure source that is adapted to provide positive and negative pressure;
- an end effector having a base with a plurality of spaced apart tines extending therefrom, the end effector having a top side with a plurality of end effector portals formed therein, and each end effector portal being in fluid communication with the pressure source;
- a generally rectangular vacuum chuck having a top side with a plurality of vacuum chuck portals formed therein, each vacuum chuck portal being in fluid communication with the pressure source;
- a generally rectangular intermediate member that selectively cooperates with the vacuum chuck to support the substrate for transfer of the substrate between the vacuum chuck and the intermediate member, the intermediate member having a plurality of receiving spaces and a plurality of transfer members, each receiving space being adapted to receive at least one tine, and each transfer member being adjacent to at least one tine when the end effector engages the intermediate member, and each transfer member having a top side with a plurality of transfer member portals formed therein that are each in fluid communication with the pressure source, and wherein the top sides of the vacuum chuck and the transfer members are generally coplanar;
- a mechanical arm secured to the end effector that is adapted to move the end effector from a first position of the substrate to the intermediate member;
- a carriage extending along at least a portion of a pair of opposing sides of each of the intermediate member and the vacuum chuck, wherein the carriage engages at least a portion of the substrate when the pressure source provides positive pressure to the vacuum chuck portals and transfer member portals to move the substrate between the intermediate member and the vacuum chuck.

16. The apparatus of claim 15, wherein the pressure source further comprises:
- a manifold that is in fluid communication with the vacuum chuck portals and transfer member portals;
- a vacuum pump in selective fluid communication with the manifold; and
- a positive pressure pump that is in selective fluid communication with the manifold.

17. The apparatus of claim 15, wherein the top sides of the transfer members have an anti-static coating.

18. The apparatus of claim 15, wherein the top side of the vacuum chuck has an anti-static coating.

19. The apparatus of claim 15, wherein the apparatus further comprises a gas ionizer located in a position above the top sides of the transfer members and the vacuum chuck.

* * * * *